United States Patent
Khang (10) Patent No.: US 6,765,833 B2
(45) Date of Patent: Jul. 20, 2004

(54) INTEGRATED CIRCUIT DEVICES INCLUDING EQUALIZATION/PRECHARGE CIRCUITS FOR IMPROVING SIGNAL TRANSMISSION

(75) Inventor: Chang-man Khang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/617,402

(22) Filed: Jul. 10, 2003

(65) Prior Publication Data

US 2004/0037123 A1 Feb. 26, 2004

(30) Foreign Application Priority Data

Aug. 10, 2002 (KR) .............................. 10-2002-0047380

(51) Int. Cl.[7] .............................................. G11C 7/00
(52) U.S. Cl. ...................................... 365/203; 365/63
(58) Field of Search ................................ 365/203, 222, 365/51, 63

(56) References Cited

U.S. PATENT DOCUMENTS 4,682,200 A * 7/1987 Uchida et al. .............. 365/190
6,097,648 A * 8/2000 Bessho et al. .............. 365/203

* cited by examiner

Primary Examiner—Gene N. Auduong
(74) Attorney, Agent, or Firm—Myers Bigel Sibley & Sajovec (57) ABSTRACT

An integrated circuit device includes first and second complementary data line pairs, e.g., global or local I/O data line pairs, disposed on a substrate and extending along a first direction, the first and second complementary data line pairs arranged such that first and second data lines of the first complementary data line pair have a first data line of the second complementary data line pair disposed therebetween. An equalization transistor includes respective first and second source/drain regions in the substrate that are coupled to respective ones of the first and second data lines of the first complementary data line pair and an equalization transistor gate electrode disposed on the substrate between the first and second data lines of the first complementary data line pair. A first precharge transistor includes the first source/drain region, a third source/drain region in the substrate displaced from the first source/drain region along the first direction, and a first precharge transistor gate electrode disposed on the substrate between the first and third source/drain regions. A second precharge transistor includes the second source/drain region, a fourth source/drain region in the substrate displaced from the second source/drain region along the first direction, and a second precharge transistor gate electrode disposed on the substrate between the second and fourth source/drain regions. A precharge voltage bus conductor is disposed on the substrate and is electrically coupled to the third and fourth source/drain regions.

27 Claims, 11 Drawing Sheets

INTEGRATED CIRCUIT DEVICES INCLUDING EQUALIZATION/PRECHARGE CIRCUITS FOR IMPROVING SIGNAL TRANSMISSION

RELATED APPLICATION

This application claims priority from Korean Patent Application No. 02-47380, filed Aug. 10, 2002, the contents of which are incorporated herein by reference in their entirety.

BACKGROUND OF THE INVENTION

The present invention relates to integrated circuit devices, and more particularly, to devices including equalization/precharge circuits for complementary data line pairs, such as complementary local and global input/output (I/O) line pairs found in memory circuits.

Dynamic random access memory (DRAM) circuits typically employ shared sense amplifiers to increase density, and include a hierarchical I/O line structure including local I/O line pairs and global I/O line pairs in order to simultaneously access multiple data.

Recently, as operating speeds of DRAMs have increased, signal transmission characteristics of a local I/O line pair and a global I/O line pair have become more critical, particularly signal transmission characteristics of local I/O line pairs. When write and read operations are not being performed, local I/O line pairs typically are equalized and precharged. When a write operation or a read operation is performed, equalization and precharge operations are typically suspended.

In order to improve signal transmission characteristics, the parasitic resistance and capacitance of the complementary lines of a local I/O line pair should be substantially the same. Otherwise, equalization and precharge of the local I/O line pair may occur asymmetrically, which can degrade signal transmission characteristics.

Figure 1:
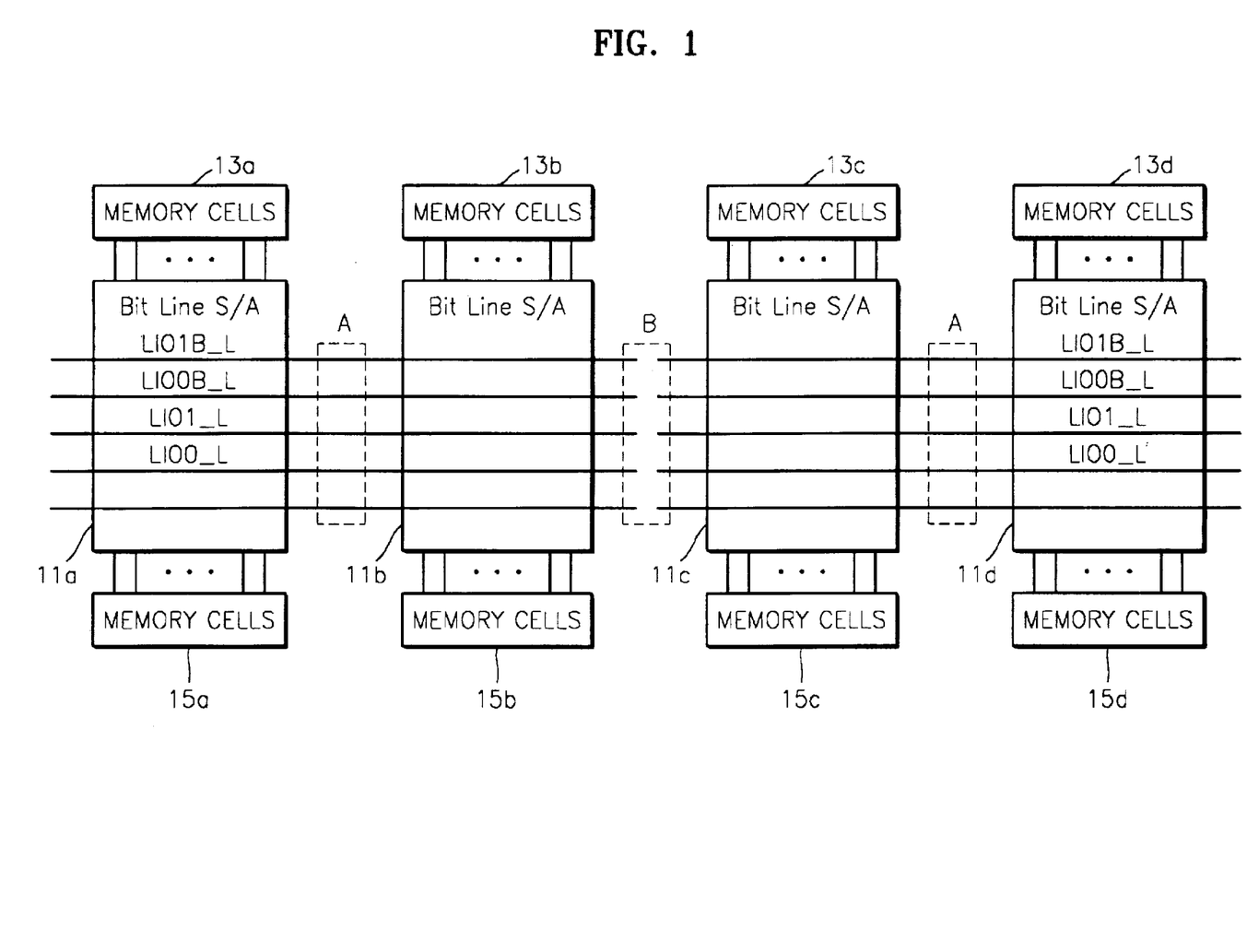
FIG. 1 is a diagram of the layout of a memory cell array part of a conventional DRAM.

FIG. 1 is a diagram of the layout of a memory cell array portion of a conventional DRAM. Bit line sense amplifier blocks 11a–11d are shared by upper memory cell blocks 13a–13d and lower memory cell blocks 15a–15d. A plurality of left local I/O line pairs LIO0_L/LIO0B_L, LIO1_L/LIO1B_L are connected to the bit line sense amplifier blocks 11a, 11b through a predetermined path (not shown) and are arranged in parallel. A plurality of right local I/O line pairs LIO0_R/LIO0B_R, LIO1_R/LIO1B_R are connected to the bit line sense amplifier blocks 11c, 11d through a predetermined path (not shown) and are arranged in parallel. For convenience of explanation, only two left local I/O line pairs and two right local I/O line pairs are shown in FIG. 1, but it will be appreciated that more I/O line pairs may be present.

The left local I/O line pairs LIO0_L/LIO0B_L, LIO1_L/LIO1B_L are not arranged in pairs. Rather, the left local I/O line pairs LIO0_L/LIO0B_L, LIO1_L/LIO1B_L are arranged in order of a first I/O line LIO0_L, a second I/O line LIO1_L, the complementary line LIO0B_L of the first I/O line and the complementary line LIO01B_L of the second I/O line. Likewise, the right local I/0 line pairs LIO0_R/LIO0B_R, LIO1_R/LIO1B_R are not arranged in units of pair, but are arranged in order of a first I/O line LIO0_R, a second I/O line LIO1_R, the complementary line LIO0B_R of the first I/O line and the complementary line LIO01B_R of the second I/O line. In the regions A, B between respective bit line sense amplifiers are disposed equalization/precharge circuits which equalize and precharge the local I/O line pairs LIO0_L/LIO0B_L, LIO1_L/LIO1B_L, LIO0_R/LIO0B_R, LIO1_R/LIO1B_R.

Figure 2:
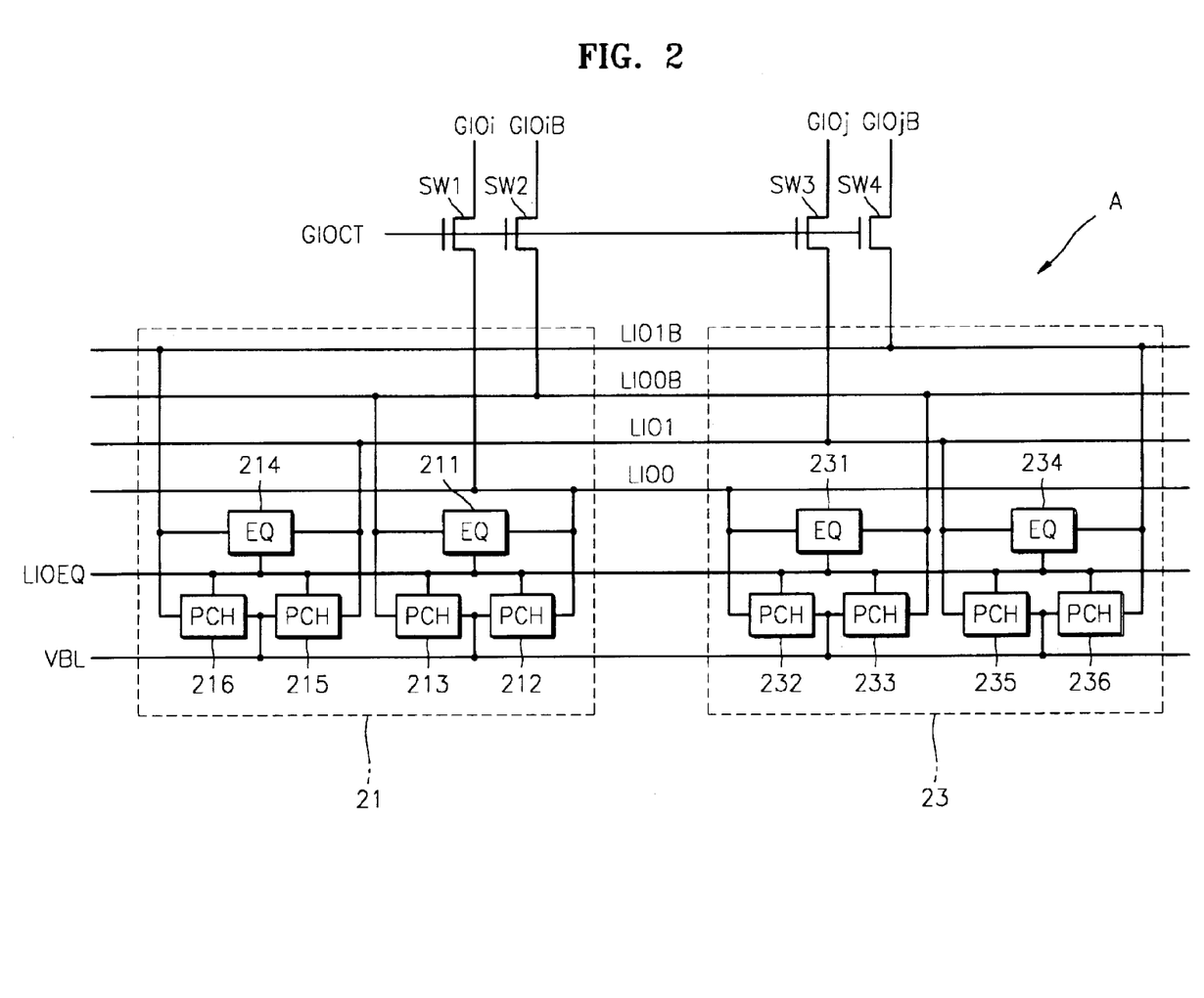
FIG. 2 is a diagram of the structure of an equalization/precharge circuit in region-A of FIG. 1.

FIG. 2 is a diagram of the structure of an equalization/precharge circuit in region A of FIG. 1. Two equalization/precharge circuits 21 and 23 are arranged in region A. The equalization/precharge circuit 21 has a first equalization transistor 211, a first precharge transistor 212, a second precharge transistor 213, a second equalization transistor 214, a third precharge transistor 215, and a fourth precharge transistor 216. The equalization/precharge circuit 23 has a first equalization transistor 231, a first precharge transistor 232, a second precharge transistor 233, a second equalization transistor 234, a third precharge transistor 235, and a fourth precharge transistor 236. The first local I/O line pair LIO0, LIO0B is connected to a global I/O line pair GIOi, GIOiB through switch transistors SW1, SW2, and the second local I/O line pair LIO1, LIO1B are connected to a global I/O line pair GIOj, GIOjB.

Figure 3:
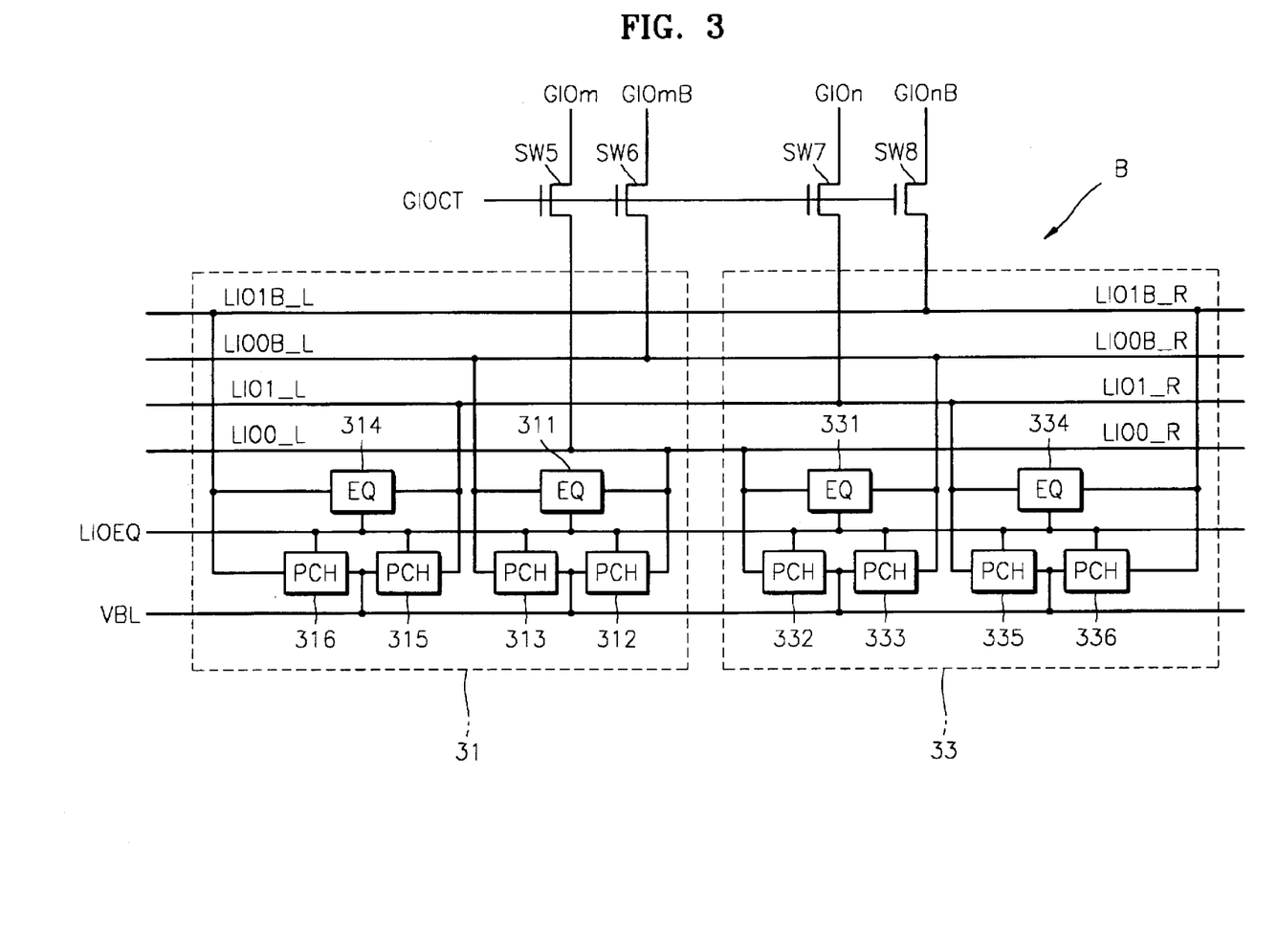
FIG. 3 is a diagram of the structure of an equalization/precharge circuit in region-B of FIG. 2.

FIG. 3 is a diagram of the structure of an equalization/precharge circuit in region B of FIG. 2. Two equalization/precharge circuits 31 and 33 are arranged in the region B. The equalization/precharge circuit 31 has a first equalization transistor 311, a second precharge transistor 312, a third precharge transistor 313, a second equalization transistor 314, a third precharge transistor 315, and a fourth precharge transistor 316. The equalization/precharge circuit 33 has a first equalization transistor 331, a second precharge transistor 332, a third precharge transistor 333, a second equalization transistor 334, a third precharge transistor 335, and a fourth precharge transistor 336. The first left local I/O line pair LIO0_L, LIO0B_L is connected to a global I/O line pair GIOm, GIOmB through switch transistors SW5, SW6, and the second right local I/O line pair LIO1_R, LIO1B_R are connected to a global I/O line pair GIOn, GIOnB.

Figure 4:
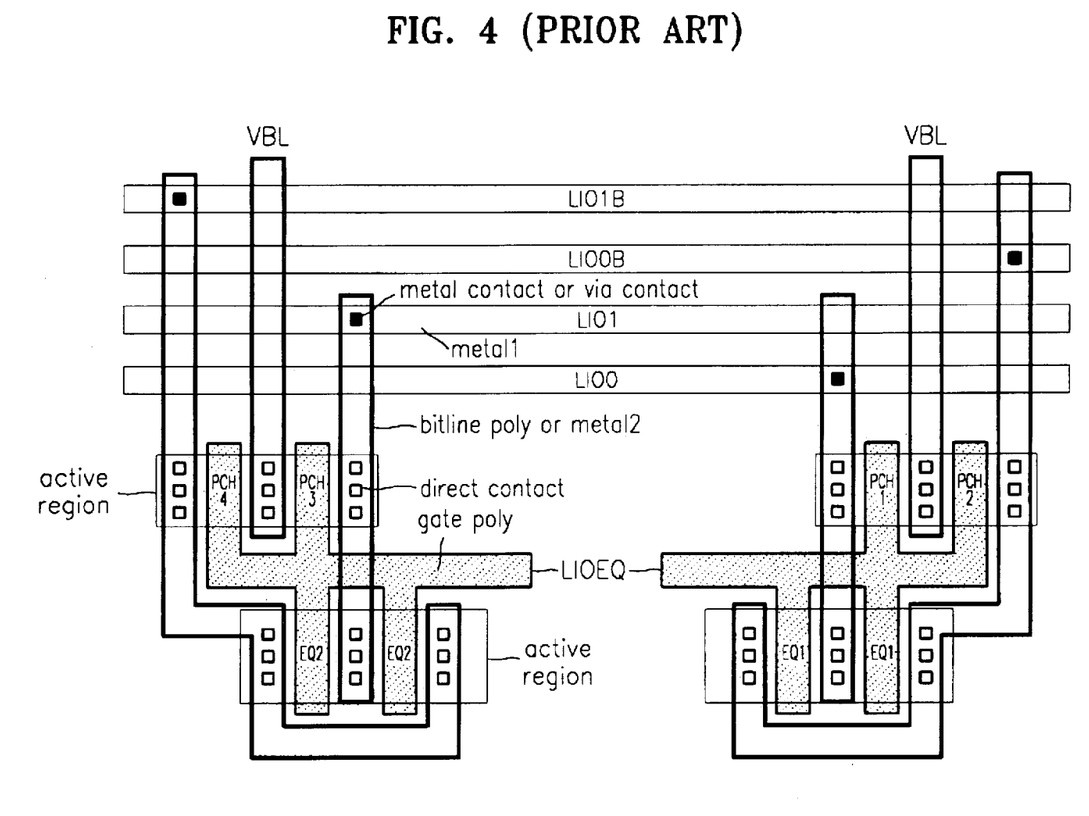
FIG. 4 is a diagram of the prior art layout of the equalization/precharge circuit shown in FIG. 2.
Figure 5:
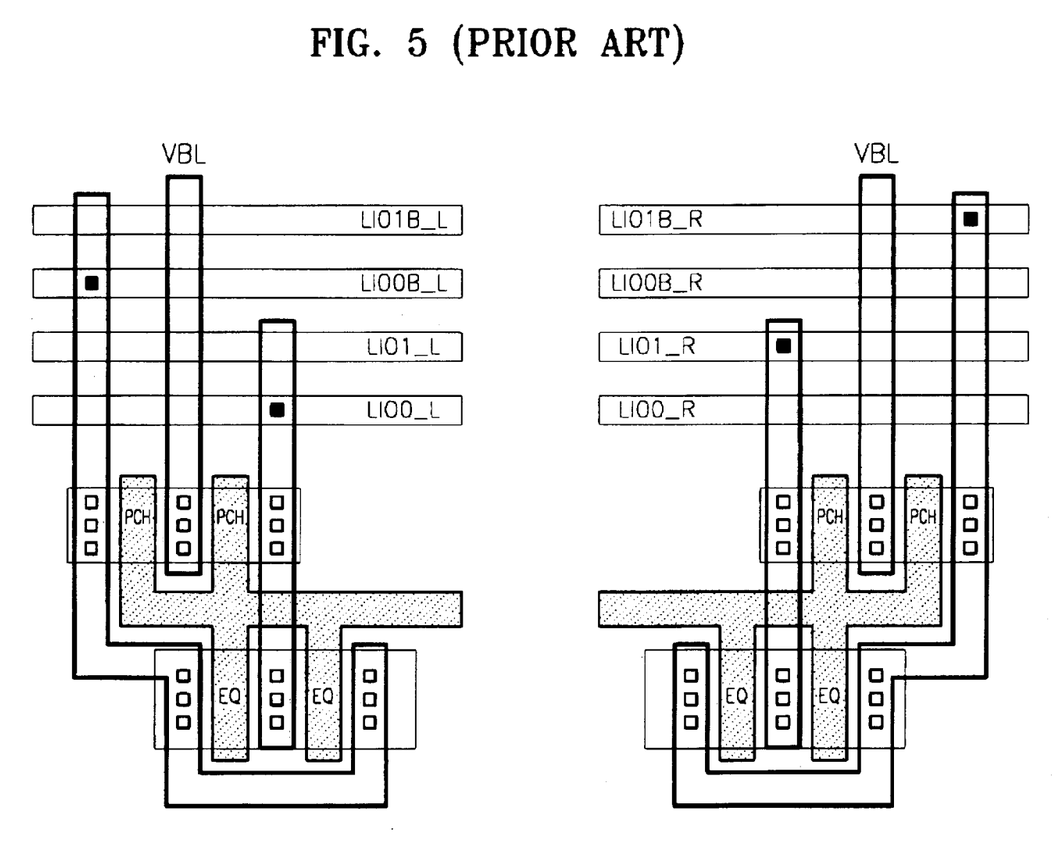
FIG. 5 is a diagram of the prior art layout of the equalization/precharge circuit shown in FIG. 3.
Figure 6:
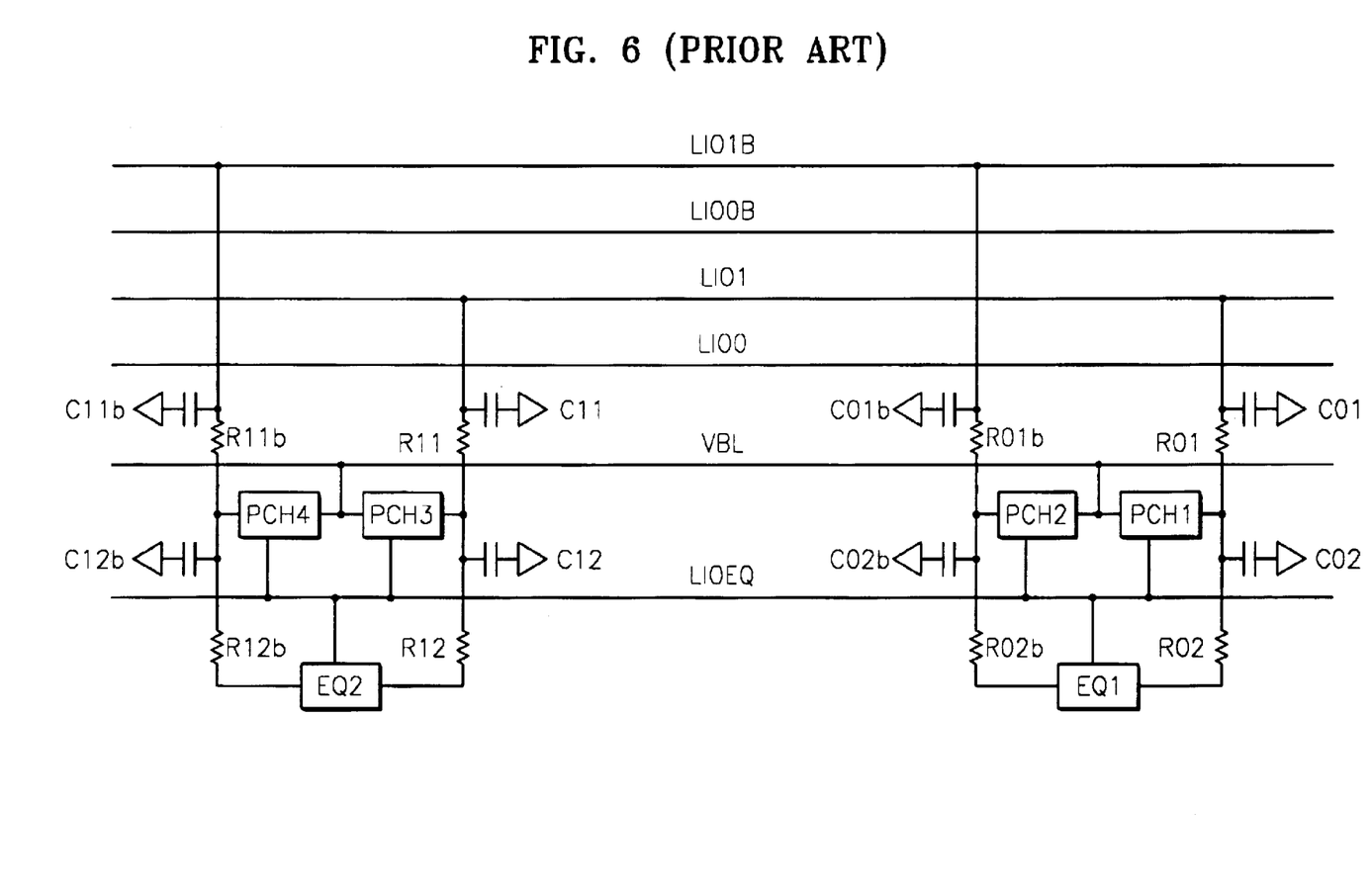
FIG. 6 is a diagram of an equivalent circuit containing modeling of a parasitic resistance and a parasitic capacitance in the layout of FIG. 4.

FIG. 4 is a diagram of a conventional layout for the equalization/precharge circuit shown in FIG. 2, and FIG. 5 is a diagram of a conventional layout for the equalization/precharge circuit shown in FIG. 3. FIG. 6 is a diagram of an equivalent circuit that models parasitic resistance and parasitic capacitance in the layout of FIG. 4. EQ1, PCH1, PCH2, EQ2, PCH3, and PCH4 of FIG. 4 correspond to the equalization transistor 231, the precharge transistor 232, the precharge transistor 233, the equalization transistor 214, the precharge transistor 215, and the precharge transistor 216, respectively, of FIG. 2.

In the conventional layouts of FIGS. 4 and 5, an equalization/precharge circuit is arranged below local I/O line pairs LIO0/LIO0B, LIO1/LIO1B. Transistors are connected by using jumped lines, such as bitline poly silicon (bitline poly) or second metal (Metal2), which can make the parasitic resistance and capacitance of the local I/O lines LIO0, LIO1 different from the parasitic resistance and capacitance of the complementary lines LIO0B, LIO1B, as shown in FIG. 6. In particular, the parasitic capacitance C01 between LIO0 and PCH1 may be different from the parasitic capacitance C01b between LIO0B and PCH2, and the parasitic resistance R01 between LIO0 and PCH1 may be different from the parasitic resistance R01b between LIO0B and PCH2. In addition, the parasitic capacitance C02 between PCH1 and EQ1 may be different from the parasitic capacitance C02b between PCH2 and EQ1, and the parasitic resistance R02 between PCH1 and EQ1 may be different from the parasitic resistance R02b between PCH2 and EQ1. The parasitic capacitance C11 between LIO1 and PCH3 may be different from the parasitic capacitance C11b between LIO1B and PCH4, and the parasitic resistance R11 between LIO1 and PCH3 may be different from the parasitic resistance R11b between LIO1B and PCH4. The parasitic capacitance C12 between PCH3 and EQ2 may be different from the parasitic capacitance C12b between PCH4 and EQ2, and the parasitic resistance R12 between PCH3 and EQ2 may be different from the parasitic resistance R12b between PCH4 and EQ2.

Due to these differences, equalization and precharge operations for the local I/O line LIO0 and its complementary line LIOB may occur asymmetrically, and equalization and precharge operations for the local I/O line LIO1 and its complementary line LIO1B may also occur asymmetrically. Consequently, signal transmission characteristics of the local I/O line pairs may be degraded, which may decrease operating speed.

SUMMARY OF THE INVENTION

According to some embodiments of the present invention, an integrated circuit device includes first and second complementary data line pairs, e.g., global or local I/O data line pairs, disposed on a substrate and extending along a first direction, the first and second complementary data line pairs arranged such that first and second data lines of the first complementary data line pair have a first data line of the second complementary data line pair disposed therebetween. The device further includes an equalization transistor including respective first and second source/drain regions in the substrate that are coupled to respective ones of the first and second data lines of the first complementary data line pair and an equalization transistor gate electrode disposed on the substrate between the first and second data lines of the first complementary data line pair. The device also includes a first precharge transistor including the first source/drain region, a third source/drain region in the substrate displaced from the first source/drain region along the first direction, and a first precharge transistor gate electrode disposed on the substrate between the first and third source/drain regions. A second precharge transistor includes the second source/drain region, a fourth source/drain region in the substrate displaced from the second source/drain region along the first direction, and a second precharge transistor gate electrode disposed on the substrate between the second and fourth source/drain regions. A precharge voltage bus conductor is disposed on the substrate and is electrically coupled to the third and fourth source/drain regions.

The first and second source/drain regions may underlie the first and second data lines of the first complementary data line pair, respectively, and the equalization transistor gate electrode may include a first elongate conductive region disposed between the first and second data lines of the first complementary data line pair. The first and second precharge transistor gate electrodes may include a second elongate conductive region extending along a second direction transverse to the first direction and disposed between the first and third source/drain regions and between the second and fourth source/drain regions. The first elongate conductive region may extend contiguously and substantially perpendicularly from the second elongate conductive region.

According to further embodiments of the invention, the second complementary data line pair includes a second data line disposed adjacent the second data line of the first complementary data line pair, and the device may further include a conductive line disposed adjacent the second data line of the second complementary data line pair and electrically connected to first data line of the first complementary data line pair. A second equalization transistor includes respective fifth and sixth source/drain regions in the substrate that are coupled to respective ones of the second data line of the second complementary data line pair and the conductive line and a second equalization transistor gate electrode disposed on the substrate between the second data line of the second complementary data line pair and the conductive line. A third precharge transistor includes the fifth source/drain region, a seventh source/drain region in the substrate displaced from the fifth source/drain region along the first direction, and a third precharge transistor gate electrode disposed on the substrate between the fifth and seventh source/drain regions. A fourth precharge transistor includes the sixth source/drain region, an eighth source/drain region in the substrate displaced from the sixth source/drain region along the first direction, and a fourth precharge transistor gate electrode disposed on the substrate between the sixth and eighth source/drain regions. The precharge voltage bus conductor is electrically coupled to the seventh and eighth source/drain regions. In some embodiments, the conductive line is coupled to the first data line of the second complementary data line pair by a jumper that crosses the second data line of the first complementary data line pair and the second data line of the second complementary data line pair. In other embodiments, the conductive line includes an extension of the first data line of the second complementary data line pair. The device may further include an equalization transistor including the second and fifth source/drain regions coupled to respective ones of the second data line of the first complementary data line pair and the second data line of the second complementary data line pair and a third equalization transistor gate electrode disposed on the substrate between the second data line of the first complementary data line pair and the second data line of the second complementary data line pair.

According to a further aspect of the present invention, there is provided an equalization/precharge circuit which equalizes and precharges a first data line, a second data line, the complementary data line of the first data line, and the complementary data line of the second data line which are sequentially arranged in parallel to each other and are connected through column selection transistors to a first bit line, a second bit line, the complementary bit line of the first bit line, and the complementary bit line of the second bit line which are connected to a memory cell array, the equalization/precharge circuit including a first equalization transistor which equalizes the first data line and the complementary data line of the first data line; a first precharge transistor which precharges the first data line to a predetermined voltage level; a second precharge transistor which precharges the complementary data line of the first data line to the predetermined voltage level; a second equalization transistor which equalizes the second data line and the complementary data line of the second data line; a third precharge transistor which precharges the second data line to the predetermined voltage level; and a fourth precharge transistor which precharges the complementary data line of the second data line to the predetermined voltage level, wherein the gates of the first equalization transistor, the first precharge transistor, and the second precharge transistor are arranged in an active region being connected to each other in a T shape, and the gates of the second equalization transistor, the third precharge transistor, and the fourth precharge transistor are also arranged in the active region being connected to each other in a T shape.

According to another aspect of the present invention, there is provided an equalization/precharge circuit which equalizes and precharges a first data line, a second data line, the complementary data line of the first data line, and the complementary data line of the second data line which are sequentially arranged in parallel to each other and are connected through column selection transistors to a first bit line, a second bit line, the complementary bit line of the first bit line, and the complementary bit line of the second bit line which are connected to a memory cell array, the equalization/precharge circuit including a first equalization transistor which equalizes the first data line and the complementary data line of the first data line; a first precharge transistor which precharges the first data line to a predetermined voltage level; a second precharge transistor which precharges the complementary data line of the first data line to the predetermined voltage level; a second equalization transistor which equalizes the second data line and the complementary data line of the second data line; a third precharge transistor which precharges the second data line to the predetermined voltage level; a fourth precharge transistor which precharges the complementary data line of the second data line to the predetermined voltage level; and an additional equalization transistor which equalizes the first data line and the second data line, wherein the gates of the first equalization transistor, the first precharge transistor, and the second precharge transistor are arranged in an active region being connected to each other in a T shape, and the gates of the second equalization transistor, the third precharge transistor, and the fourth precharge transistor are also arranged in the active region being connected to each other in a T shape, and the gate of the additional equalization transistor is also arranged in a T shape in the active region.

According to another aspect of the present invention, there is provided a layout structure of an equalization/precharge circuit which equalizes and precharges a first data line, a second data line, the complementary data line of the first data line, and the complementary data line of the second data line which are sequentially arranged in parallel to each other and are connected through column selection transistors to a first bit line, a second bit line, the complementary bit line of the first bit line, and the complementary bit line of the second bit line which are connected to a memory cell array, the layout structure including a first active region; a second active region; and a gate region which is arranged in a T shape in the first active region and is also arranged in a T shape in the second active region, wherein the first active region is separated into three active regions by the T-shape gate region and the three active regions are connected to the first data line, the complementary data line of the first data line, and a predetermined voltage line, respectively, and the second active region is separated into three active regions by the T-shape gate region and the three active regions are connected to the second data line, the complementary data line of the second data line, and the predetermined voltage line, respectively.

It is desirable that the complementary data line of the first data line is connected to one of the three active regions in the first active region through a predetermined jumped pattern line.

It is desirable that the complementary data line of the first data line is connected directly to one of the three active regions in the first active region without a predetermined jumped pattern line.

It is desirable that the first active region and the second active region are one active region in which the two active regions are connected to each other. It is desirable that the first active region and the second active region are connected to each other and on the active region where the two active regions are connected to each other, the gate region is extended and arranged in a T shape.

According to another aspect of the present invention, there is provided a semiconductor memory device including a memory cell array; a first bit line, a second bit line, the complementary bit line of the first bit line, and the complementary bit line of the second bit line which are connected to the memory cell array; a first data line, a second data line, the complementary data line of the first data line, and the complementary data line of the second data line which are sequentially arranged in parallel to each other and are connected through column selection transistors to the first bit line, the second bit line, the complementary bit line of the first bit line, and the complementary bit line of the second bit line; and an equalization/precharge circuit according to an embodiment of the present invention.

According to another aspect of the present invention, there is provided a semiconductor memory device including a memory cell array; a first bit line, a second bit line, the complementary bit line of the first bit line, and the complementary bit line of the second bit line which are connected to the memory cell array; a first data line, a second data line, the complementary data line of the first data line, and the complementary data line of the second data line which are sequentially arranged in parallel to each other and are connected through column selection transistors to the first bit line, the second bit line, the complementary bit line of the first bit line, and the complementary bit line of the second bit line; and an equalization/precharge circuit according to another embodiment of the present invention.

It is desirable that the first and second data lines are local I/O lines or global I/O lines.

DETAILED DESCRIPTION

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity.

It will be understood that when an element such as a layer, region or substrate is referred to as being "on" another element, it can be directly on the other element or intervening elements may also be present. In contrast, when an element is referred to as being "directly on" another element, there are no intervening elements present.

Figure 7:
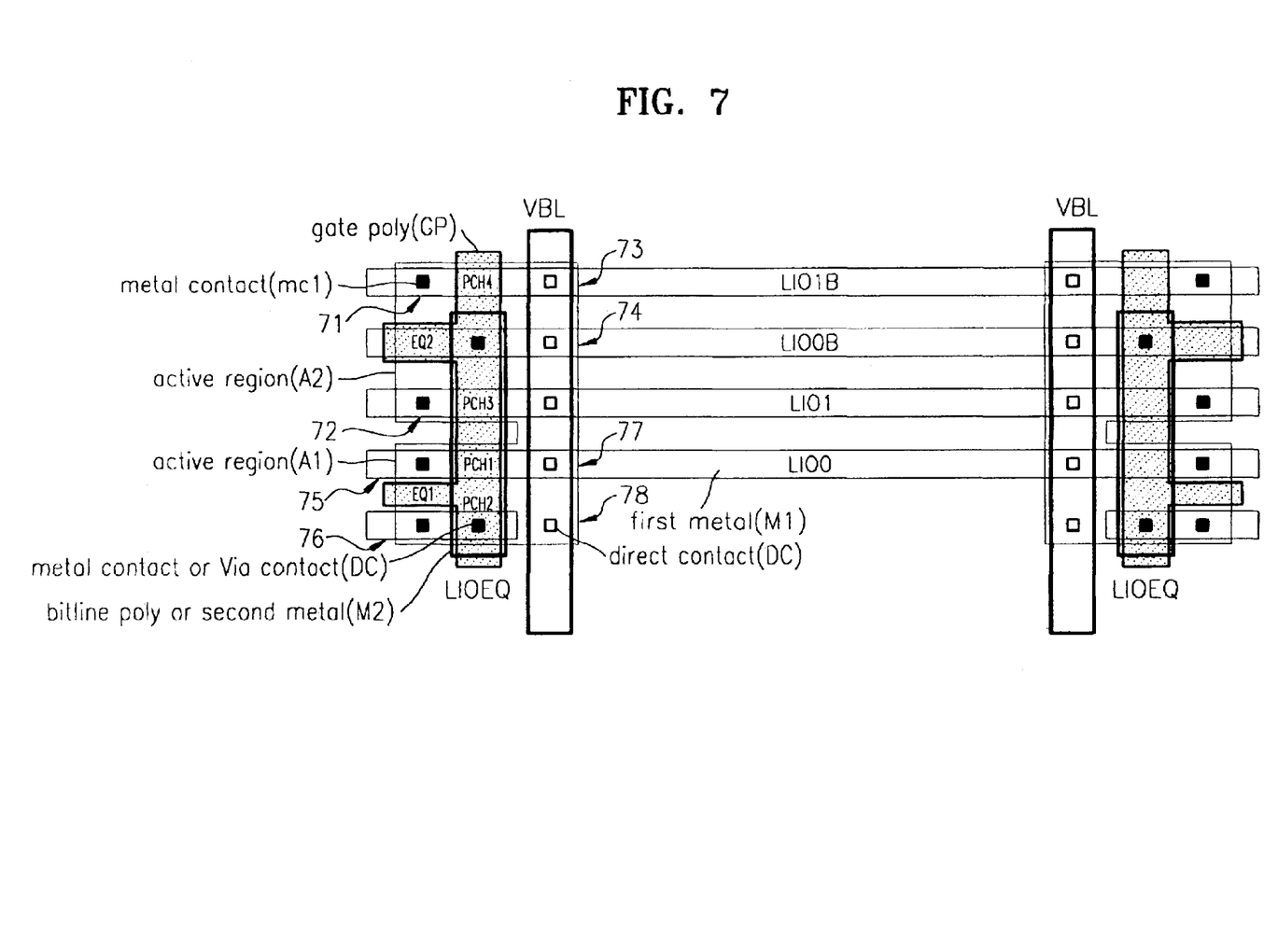
FIG. 7 is a diagram of a layout of an equalization/precharge circuit according to some embodiments of the present invention.

FIG. 7 is a layout diagram of an equalization/precharge circuit according to some embodiments of the present invention. The equalization/precharge circuit may be used, for example, in a region such as the region A of the DRAM shown in FIG. 1. Only two local I/O line pairs LIO0/LIO0B, LIO1/LIO1B are shown for convenience of explanation, but it will be appreciated that more local I/O line pairs may be present.

Referring to FIG. 7, the local I/O line pairs LIO0/LIO0B, LIO1/LIO1B formed on a substrate (not shown) are not arranged as adjacent complementary pairs. Rather, they are arranged in order of a first I/O line LIO0, a second I/O line LIO1, a complementary line LIO0B of the first I/O line, and a complementary line LIO1B of the second I/O line.

A first equalization transistor EQ1, a first precharge transistor PCH1, and a second precharge transistor PCH2 are arranged in an active region A1, and are connected to each other by a T-shaped portion of a gate region GP, with source/drain regions for the first equalization transistor EQ1, the first precharge transistor PCH1 and the second precharge transistor PCH2 in the active region A1 being indicated generally at 75, 76, 77, and 78. A second equalization transistor EQ2, a third precharge transistor PCH3, and a fourth precharge transistor PCH4 are arranged in an active region A2, and are connected to each other by another T-shaped portion of the gate region GP, with source/drain regions for the second equalization transistor EQ2, the third precharge transistor PCH3, and the fourth precharge transistor PCH4 in the active regions A2 being indicated generally at 71, 72, 73, and 74. The gate conductor is driven by a control signal LIOEQ. The active regions A1 and A2 may be connected to each other as shown in FIG. 7, or may be separate.

The first active region A1 is generally divided into three portions by the gate region GP. The three active region portions are connected to the first local I/O line LIO0, the complementary line LIO0B, and a voltage line VBL, respectively. The complementary line LIO0B of the first local I/O line LIO0 is connected to one of the three active region portions through a jumper pattern line (M2) formed from a bitline polysilicon layer or a second metal layer.

The second active region A2 is separated into three active region portions by the gate region GP. The three active region portions are connected to the second local I/O line LIO1, the complementary line LIO1B, and the voltage line VBL, respectively. The local I/O line pairs LIO0/LIO0B, LIO1/LIO1B are formed from a first metal layer M1. In FIG. 7, MC1 indicates a metal contact, MC2 indicates a metal contact or a via contact, and DC indicates a direct contact.

In response to a control signal LIOEQ, the first equalization transistor EQ1 equalizes the first local I/O line LIO0 and the complementary line LIO0B of the first local I/O line. In response to the control signal LIOEQ, the first precharge transistor PCH1 precharges the first local I/O line LIO0 to the level of the voltage line VBL. In response to the control signal LIOEQ, the second precharge transistor PCH2 precharges the complementary line LIO0B of the first local I/O line to the level of the voltage line VBL.

In response to a control signal LIOEQ, the second equalization transistor EQ2 equalizes the second local I/O line LIO1 and the complementary line LIO1B. In response to the control signal LIOEQ, the third precharge transistor PCH3 precharges the second local I/O line LIO1 to the level of the voltage line VBL. In response to the control signal LIOEQ, the fourth precharge transistor PCH4 precharges the complementary line LIO1B to the level of the voltage line VBL.

Figure 8:
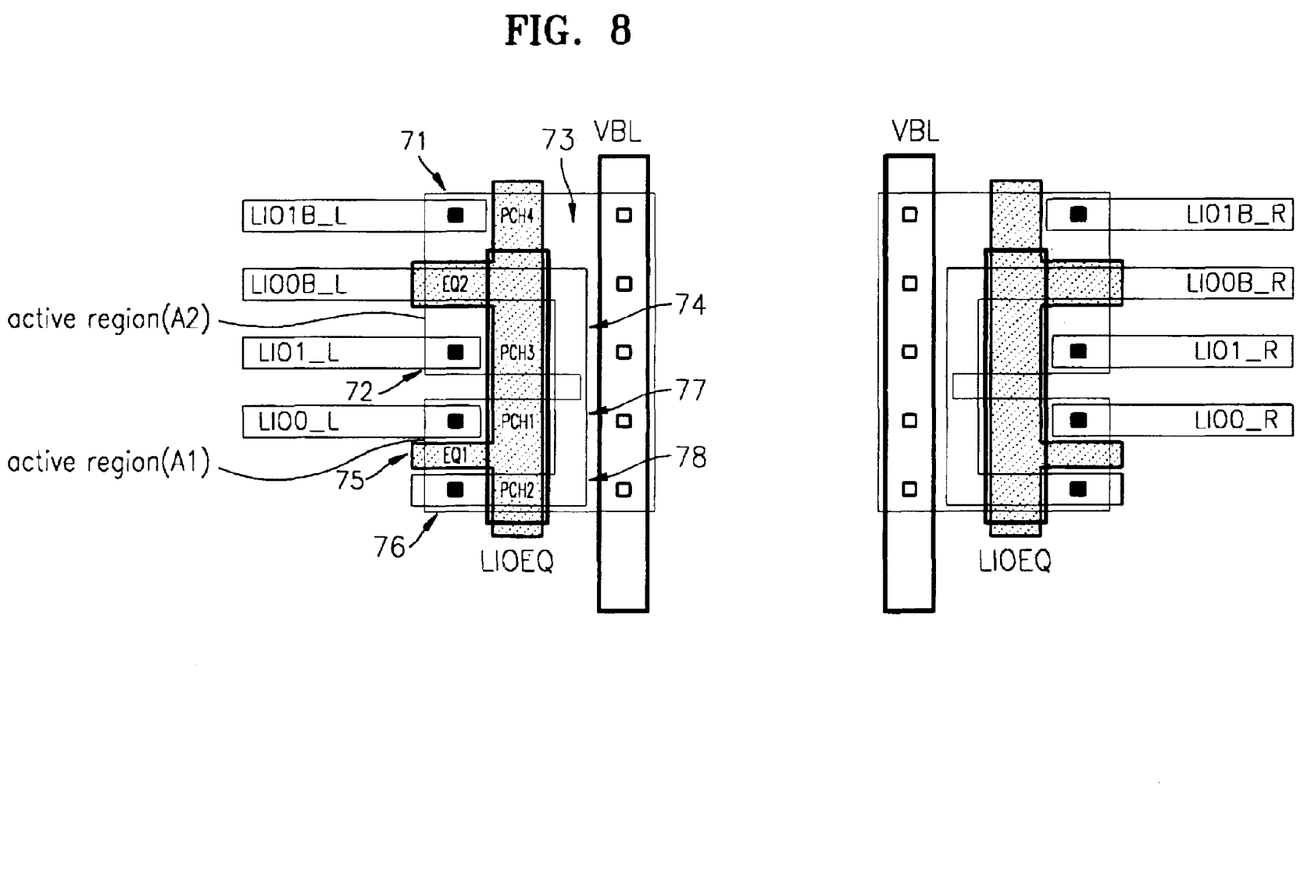
FIG. 8 is a diagram of the layout of an equalization/precharge circuit according to further embodiments of the present invention.

FIG. 8 is a layout diagram of an equalization/precharge circuit according to further embodiments of the present invention, which may be used, for example, in the region B of the DRAM shown in FIG. 1. The circuit of FIG. 8 is nearly the same as the circuit of FIG. 7, with like elements being indicated by like reference numerals. However, the complementary line LIO0B_L, LIO0B_R of a first I/O line LIO0_L, LIO0_R is directly connected to one of three portions of a first active region A1 without being connected through a jumper pattern line.

Figure 9:
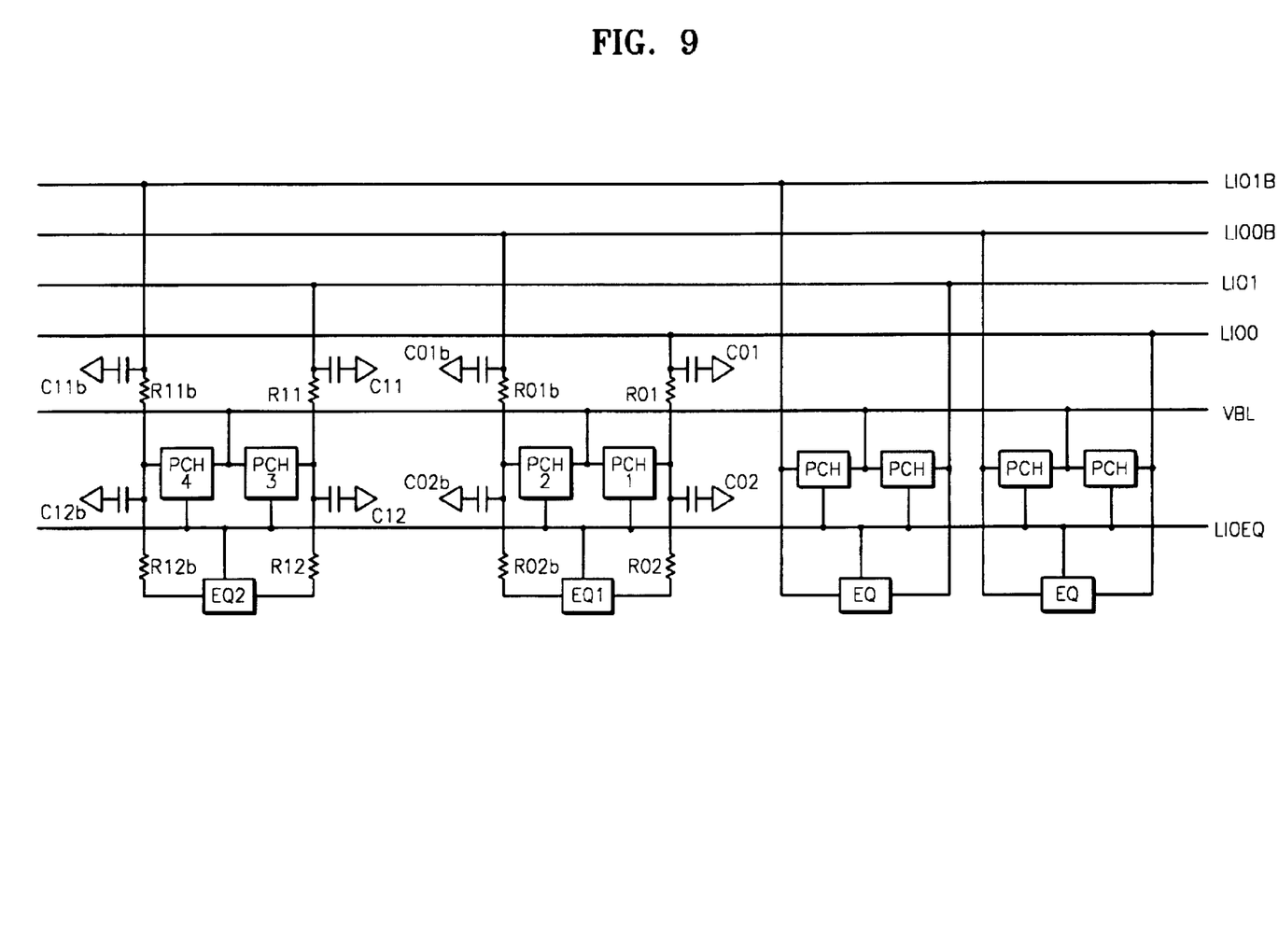
FIG. 9 is a diagram of an equivalent circuit including modeling of a parasitic resistance and a parasitic capacitance in the layout of FIG. 7.

FIG. 9 is a schematic diagram of an equivalent circuit for the layout of FIG. 7. Referring to FIGS. 7 and 8 in conjunction with FIG. 9, equalization transistors EQ1, EQ2 and precharge transistors PCH1, PCH2, PCH3, PCH4 are formed in a nearly symmetrical manner. Consequently, the parasitic resistance and parasitic capacitance of the local I/O lines LIO0, LIO1 are substantially the same as the parasitic resistance and parasitic capacitance of the complementary lines LIO0B, LIO1B. In particular, a parasitic capacitance C01 (the parasitic capacitance between LIO0 and PCH1) is substantially the same as the parasitic capacitance C01$b$ (the parasitic capacitance between LIO0B and PCH2), and the parasitic resistance R01 (the parasitic resistance between LIO0 and PCH1) is substantially the same as the parasitic resistance R01$b$ (the parasitic resistance between LIO0B and PCH2). The parasitic capacitance C02 (the parasitic capacitance between PCH1 and EQ1) is substantially the same as the parasitic capacitance C02$b$ (the parasitic capacitance between PCH2 and EQ1) and the parasitic resistance R02 (the parasitic resistance between PCH1 and EQ1) is substantially the same as the parasitic resistance R02$b$ (the parasitic resistance between PCH2 and EQ1).

The parasitic capacitance C11 (the parasitic capacitance between LIO1 and PCH3) is substantially the same as the parasitic capacitance C11$b$ (the parasitic capacitance between LIO1B and PCH4), and the parasitic resistance R11 (the parasitic resistance between LIO1 and PCH3) is substantially the same as the parasitic resistance R11$b$ (the parasitic resistance between LIO1B and PCH4). In addition, the parasitic capacitance C12 (the parasitic capacitance between PCH3 and EQ2) is substantially the same as the parasitic capacitance C12$b$ (the parasitic capacitance between PCH4 and EQ2) and the parasitic resistance R12 (the parasitic resistance between PCH3 and EQ2) is substantially the same as the parasitic resistance R12$b$ (the parasitic resistance between PCH4 and EQ2).

Consequently, the equalization and precharge operations of the local I/O line (LIO0) and its complementary line (LIOB) can be performed nearly symmetrically, and the equalization and precharge operations of the local I/O line (LIO1) and its complementary line (LIO1B) can also be performed nearly symmetrically. Therefore, desirable signal transmission through the local I/O line pairs can be achieved, which can increase operating speed in comparison to conventional devices.

In addition, referring to FIGS. 7 and 8, in the layouts of the first and second preferred embodiments of the present invention, equalization transistors EQ1, EQ2 and precharge transistors PCH1–PCH4 are arranged close to the local I/O line pairs LIO0/LIO0B, LIO1/LIO1B. Consequently, these layouts can greatly reduce areas for these circuits compared to the prior art layouts shown in FIGS. 4 and 5.

Figure 10:
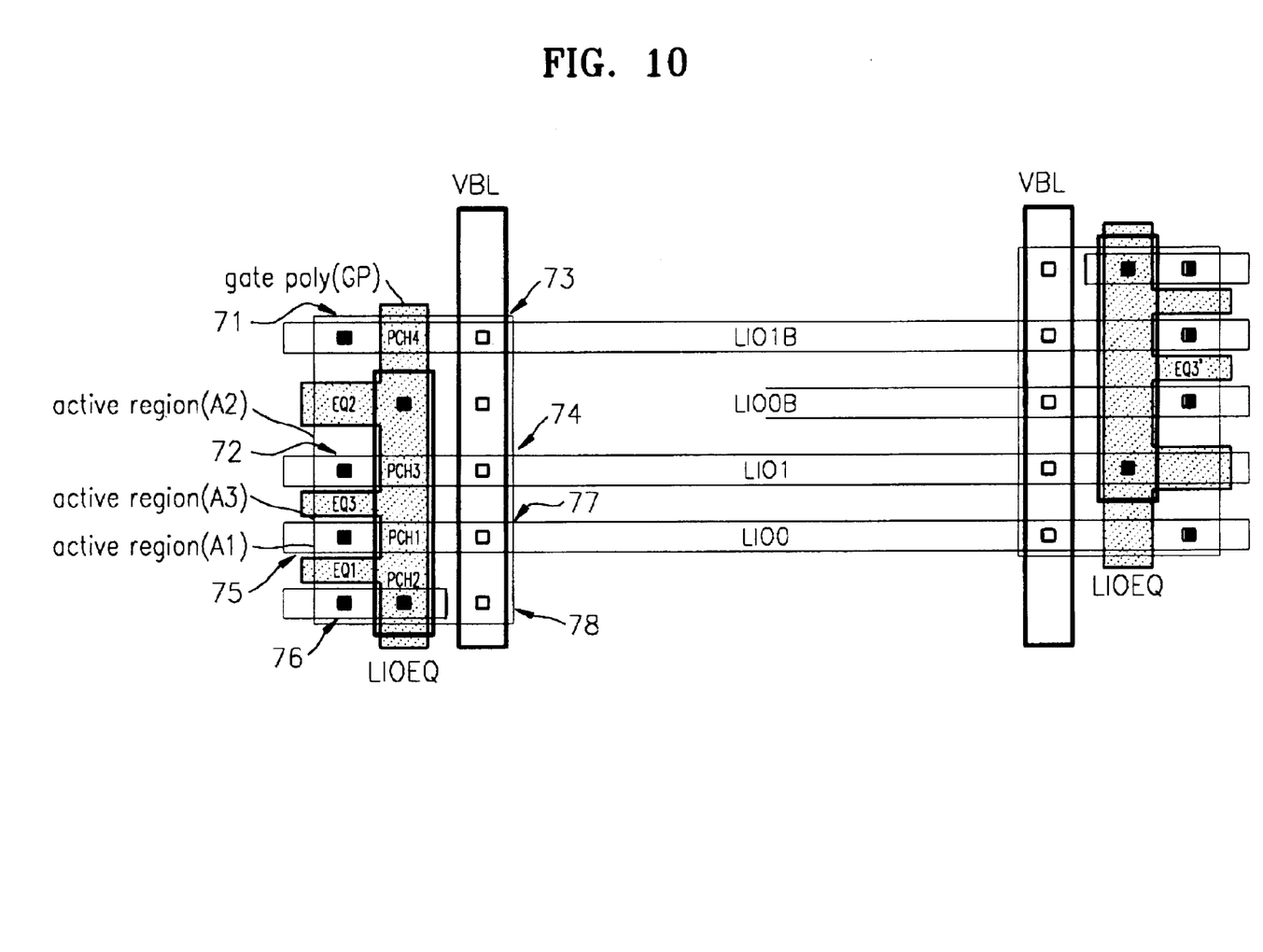
FIG. 10 is a diagram of the layout of an equalization/precharge circuit according to further embodiments of the present invention.

FIG. 10 is a diagram of the layout of an equalization/precharge circuit according to still further embodiments of the present invention, which may be used, for example, in the region A of the DRAM shown in FIG. 1. The circuit in FIG. 10 is nearly the same as the layout according to the embodiments of FIG. 7, with like items being indicated by like reference numerals. In the embodiments of FIG. 10, a first active region A1 and a second active region A2 are connected to each other. A gate region GP extends to a third active region A3, where the two active regions A1, A2 are connected, and is arranged in a T shape. An additional equalization transistor EQ3 equalizes the first I/O line LIO0 and the second I/O line LIO1 in response to a control signal LIOEQ is formed. In the right-hand side of FIG. 10, a similar additional equalization transistor EQ3' is formed. The additional equalization transistor EQ3' equalizes the complementary line LIO0B of the first I/O line and the complementary line LIO1B of the second I/O line in response to the control signal LIOEQ.

Figure 11:
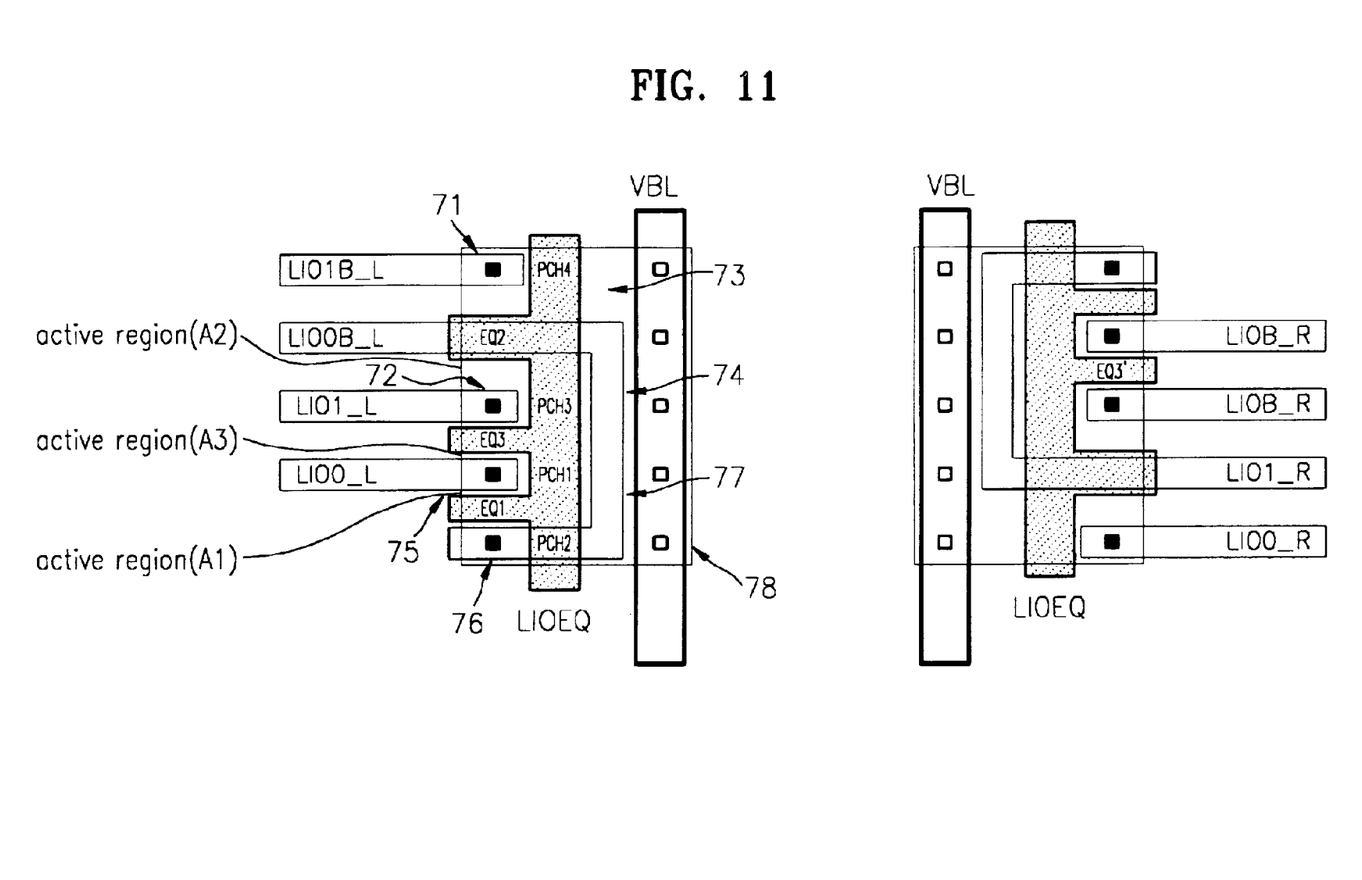
FIG. 11 is a diagram of the layout of an equalization/precharge circuit according to still further embodiments of the present invention.

FIG. 11 is a layout diagram of an equalization/precharge circuit according to still further embodiments of the present invention, which may be used, for example, in the region B of the DRAM shown in FIG. 1. The circuit in FIG. 11 is nearly the same as that illustrated in FIG. 8, with like elements indicated by like reference numerals. A first active region A1 and a second active region A2 are connected to each other, and a gate region GP is extended to a third active region A3, where the two active regions A1, A2 are connected. Accordingly, an additional equalization transistor EQ3 is formed. The additional equalization transistor EQ3 equalizes the first left I/O line LIO0_L and the second left I/O line LIO1_L in response to a control signal LIOEQ. On right-hand side of FIG. 11, a similar additional equalization transistor EQ3' is formed. The additional equalization transistor EQ3' equalizes the complementary line LIO0B_R of the first right I/O line and the complementary line LIO1B_R of the second right I/O line in response to the control signal LIOEQ.

As described above, when compared to the layouts of the embodiments of FIGS. 7 and 8, the additional equalization transistor EQ3, which equalizes the first I/O line LIO0 and the second I/O line LIO1, and the additional equalization transistor EQ3', which equalizes the complementary line LIO0B of the first I/O line and the complementary line LIO1B of the second I/O line, are additionally formed in the layouts of the embodiments of FIGS. 10 and 11. Consequently, even though the equalization and precharge level of the first I/O line LIO0 is different from the equalization and precharge level of the second I/O line LIO1, the levels the two lines LIO0, LIO1 become substantially the same by the action of the additional equalization transistor EQ3. Likewise, even though the equalization and precharge level of the complementary line LIO0B of the first I/O line LIO0 is different from the equalization and precharge level of the complementary line LIO1B of the second I/O line LIO1, the levels of the two lines LIO0B, LIO1B become substantially the same by the action of the additional equalization transistor EQ3'. Consequently, when equalization and precharge operations are performed, the levels of the all I/O line pairs become substantially the same such that signal transmission through the I/O line pairs can be performed more stably.

The equalization/precharge circuits according to various embodiments of the present invention described above can be employed and used in a DRAM, such as that shown in FIG. 1. In this case, the characteristic of signal transmission through local I/O line pairs can be improved and the operation speed of the DRAM can be increased. Also, the size of the area of the circuit can be reduced. While the equalization/precharge circuits are explained for local I/O line pairs in the above embodiments, it is clear that the equalization/precharge circuits can also be applied to global I/O line pairs.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. An integrated circuit device, comprising:
    first and second complementary data line pairs disposed on a substrate and extending along a first direction, the first and second complementary data line pairs arranged such that first and second data lines of the first complementary data line pair have a first data line of the second complementary data line pair disposed therebetween;
    an equalization transistor comprising respective first and second source/drain regions in the substrate that are coupled to respective ones of the first and second data lines of the first complementary data line pair and an equalization transistor gate electrode disposed on the substrate between the first and second data lines of the first complementary data line pair;
    a first precharge transistor comprising the first source/drain region, a third source/drain region in the substrate displaced from the first source/drain region along the first direction, and a first precharge transistor gate electrode disposed on the substrate between the first and third source/drain regions; and
    a second precharge transistor comprising the second source/drain region, a fourth source/drain region in the substrate displaced from the second source/drain region along the first direction, and a second precharge transistor gate electrode disposed on the substrate between the second and fourth source/drain regions; and
    a precharge voltage bus conductor on the substrate and electrically coupled to the third and fourth source/drain regions.

2. A device according to claim 1:
    wherein the first and second source/drain regions underlie the first and second data lines of the first complementary data line pair, respectively; and
    wherein the equalization transistor gate electrode comprises a first elongate conductive region disposed between the first and second data lines of the first complementary data line pair.

3. A device according to claim 2, wherein first elongate conductive region is substantially equidistant from the first and second data lines of the first complementary data line pair.

4. A device according to claim 2, wherein the first elongate conductive region overlies at least a portion of the first data line of the second complementary data line pair.

5. A device according to claim 2, wherein the first and second precharge transistor gate electrodes comprise a second elongate conductive region extending along a second direction transverse to the first direction and disposed between the first and third source/drain regions and between the second and fourth source/drain regions.

6. A device according to claim 5, wherein the first elongate conductive region extends contiguously and substantially perpendicularly from the second elongate conductive region.

7. A device according to claim 5, wherein the second elongate conductive region and the first and second data lines of the first complementary data line pair cross one another.

8. A device according to claim 5, wherein the second elongate conductive region and the first and second data lines of the first complementary data line pair do not cross one another.

9. A device according to claim 5, wherein the precharge voltage bus conductor comprises a conductive line extending along the second direction.

10. A device according to claim 9, wherein the first complementary data line pair and the precharge voltage bus cross one another.

11. A device according to claim 9, wherein the first complementary data line pair and the precharge voltage bus do not cross one another.

12. A device according to claim 5, wherein the first elongate conductive region and the second elongate conductive region form a T-shaped conductive region.

13. A device according to claim 1, wherein the first and second complementary data line pairs comprise first and second local input/output (I/O) line pairs of a memory circuit.

14. A device according to claim 1, wherein the first and second complementary data line pairs comprise first and second global input/output (I/O) line pairs of a memory circuit.

15. A device according to claim 1, wherein the first, second, third and fourth source/drain regions are disposed in a common active region.

16. A device according to claim 1:
wherein the equalization transistor comprises a first equalization transistor;
wherein the second complementary data line pair comprises a second data line disposed adjacent the second data line of the first complementary data line pair;
wherein the device further comprises:
a conductive line disposed adjacent the second data line of the second complementary data line pair and electrically connected to first data line of the first complementary data line pair;
a second equalization transistor comprising respective fifth and sixth source/drain regions in the substrate that are coupled to respective ones of the second data line of the second complementary data line pair and the conductive line and a second equalization transistor gate electrode disposed on the substrate between the second data line of the second complementary data line pair and the conductive line;
a third precharge transistor comprising the fifth source/drain region, a seventh source/drain region in the substrate displaced from the fifth source/drain region along the first direction, and a third precharge transistor gate electrode disposed on the substrate between the fifth and seventh source/drain regions; and a fourth precharge transistor comprising the sixth source/drain region, an eighth source/drain region in the substrate displaced from the sixth source/drain region along the first direction, and a fourth precharge transistor gate electrode disposed on the substrate between the sixth and eighth source/drain regions; and
wherein the precharge voltage bus conductor is electrically coupled to the seventh and eighth source/drain regions.

17. A device according to claim 16, wherein the conductive line is coupled to the first data line of the second complementary data line pair by a jumper that crosses the second data line of the first complementary data line pair and the second data line of the second complementary data line pair.

18. A device according to claim 16, wherein the conductive line comprises an extension of the first data line of the second complementary data line pair.

19. A device according to claim 16:
wherein the fifth and sixth source/drain regions underlie the second data line of the second complementary data line pair and the conductive line, respectively; and
wherein the second equalization transistor gate electrode comprises a first elongate conductive region disposed between the second data line of the second complementary data line pair and the conductive line.

20. A device according to claim 19, wherein first elongate conductive region is substantially equidistant from the second data line of the second complementary data line pair and the conductive line.

21. A device according to claim 19, wherein the first and second complementary data line pairs extend along a first direction, and wherein the third and fourth precharge transistor gate electrodes comprise a second elongate conductive region extending along a second direction transverse to the first direction and disposed between the fifth and seventh source/drain regions and between the sixth and eighth source/drain regions.

22. A device according to claim 21, wherein the first elongate conductive region extends contiguously and substantially perpendicularly from the second elongate conductive region.

23. A device according to claim 21, wherein the second elongate conductive region and the second data line of the second complementary data line pair cross one another.

24. A device according to claim 21, wherein the second elongate conductive region and the second data line of the second complementary data line pair do not cross one another.

25. A device according to claim 21, wherein the first elongate conductive region and the second elongate conductive region form a T-shaped conductive region.

26. A device according to claim 16, wherein the first, second, third and fourth source/drain regions are disposed in a common active region.

27. A device according to claim 16, further comprising:
a third equalization transistor comprising the second and fifth source/drain regions coupled to respective ones of the second data line of the first complementary data line pair and the second data line of the second complementary data line pair and a third equalization transistor gate electrode disposed on the substrate between the second data line of the first complementary data line pair and the second data line of the second complementary data line pair.

* * * * *